United States Patent
Lee et al.

(10) Patent No.: US 7,892,982 B2
(45) Date of Patent: Feb. 22, 2011

(54) METHOD FOR FORMING FINE PATTERNS OF A SEMICONDUCTOR DEVICE USING A DOUBLE PATTERNING PROCESS

(75) Inventors: Doo-youl Lee, Seoul (KR); Pan-suk Kwak, Hwaseong-si (KR); Sung-gon Jung, Seoul (KR); Jung-hyeon Lee, Yongin-si (KR); Suk-joo Lee, Yongin-si (KR); Cha-won Koh, Yongin-si (KR); Ji-young Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 730 days.

(21) Appl. No.: 11/978,718

(22) Filed: Oct. 30, 2007

(65) Prior Publication Data

US 2008/0124931 A1     May 29, 2008

Related U.S. Application Data

(63) Continuation-in-part of application No. 11/367,437, filed on Mar. 6, 2006, now Pat. No. 7,687,369, and a continuation-in-part of application No. 11/896,512, filed on Sep. 4, 2007, now Pat. No. 7,473,647, and a continuation-in-part of application No. 11/978,719, filed on Oct. 30, 2007.

(30) Foreign Application Priority Data

Jun. 29, 2007    (KR) .................... 10-2007-0065658

(51) Int. Cl.
*H01L 21/302* (2006.01)

(52) U.S. Cl. ............................ 438/717; 216/67; 216/79; 438/702; 438/706; 438/710; 438/714; 438/723

(58) Field of Classification Search .................. 216/67, 216/79; 438/706, 702, 710, 714, 723, 724, 438/725
See application file for complete search history.

(56) References Cited

U.S. PATENT DOCUMENTS 5,891,799 A    4/1999 Tsui (Continued)

FOREIGN PATENT DOCUMENTS

JP    2006-261307    9/2006

(Continued)

*Primary Examiner*—Lan Vinh
*Assistant Examiner*—Maki A Angadi
(74) *Attorney, Agent, or Firm*—Lee & Morse, P.C.

(57) ABSTRACT

A method for forming fine patterns of a semiconductor device includes forming an etching film on a substrate having first and second areas, forming first mask patterns on the substrate to have a first pattern density in the first area and a second pattern density in the second area, forming first capping patterns between the first mask patterns, forming second capping patterns between the first mask patterns, such that recess areas are formed between second capping patterns, and such that a first etching pattern is defined to include the first and second capping patterns, forming second mask patterns in the recess areas to include the first and second mask patterns, removing one of the first and second etching patterns, such that a single etching pattern is remaining on the substrate, and etching the etching film using the remaining etching pattern as an etch mask to form etching film patterns.

20 Claims, 11 Drawing Sheets

U.S. PATENT DOCUMENTS

| | | |
|---|---|---|
| 6,239,008 B1 | 5/2001 | Yu et al. |
| 6,403,417 B1 | 6/2002 | Chien et al. |
| 6,790,770 B2 | 9/2004 | Chen et al. |
| 7,202,174 B1 | 4/2007 | Jung et al. |
| 7,256,126 B1 | 8/2007 | Chen |
| 7,312,158 B2 | 12/2007 | Miyagawa et al. |
| 2003/0027420 A1 | 2/2003 | Lai et al. |
| 2003/0207584 A1 | 11/2003 | Sivakumar et al. |
| 2004/0017989 A1 | 1/2004 | So |
| 2004/0266098 A1* | 12/2004 | Huang et al. ............ 438/243 |
| 2005/0040134 A1* | 2/2005 | Temmler et al. ........... 216/13 |
| 2005/0269702 A1 | 12/2005 | Otsuka |
| 2006/0046484 A1* | 3/2006 | Abatchev et al. ......... 438/689 |
| 2006/0234166 A1 | 10/2006 | Lee et al. |
| 2006/0263699 A1* | 11/2006 | Abatchev et al. ............ 430/5 |
| 2007/0123037 A1 | 5/2007 | Lee et al. |
| 2008/0026541 A1 | 1/2008 | Edelstein et al. |
| 2008/0048340 A1 | 2/2008 | Lee et al. |
| 2008/0131793 A1 | 6/2008 | Lee et al. |

FOREIGN PATENT DOCUMENTS

| | | |
|---|---|---|
| KR | 10-0155880 B1 | 7/1998 |
| KR | 1998-0025458 A | 7/1998 |
| KR | 10-0165399 B1 | 9/1998 |
| KR | 10-2003-0050172 A | 6/2003 |
| KR | 10-2004-0055459 A | 6/2004 |
| KR | 10-2006-0000678 A | 1/2006 |
| KR | 10-0574999 B1 | 4/2006 |
| KR | 10-2006-0110097 A | 10/2006 |
| KR | 10-0672123 B1 | 1/2007 |

* cited by examiner

METHOD FOR FORMING FINE PATTERNS OF A SEMICONDUCTOR DEVICE USING A DOUBLE PATTERNING PROCESS

CROSS-REFERENCE TO RELATED APPLICATIONS

The present application is a continuation-in-part application of co-pending U.S. patent application Ser. No. 11/367,437, entitled, "Method of Forming Pattern Using Fine Pitch Hard Mask," which was filed on Mar. 6, 2006, now U.S. Pat. No. 7,687,639 and issued on Jan. 6, 2009, as U.S. Pat. No. 7,473,647, which is incorporated by reference herein in its entirety. The present application is also a continuation-in-part of co-pending U.S. patent application Ser. No. 11/896,512, entitled, "Method of Forming Fine Metal Patterns for a Semiconductor Device Using a Damascene Process," which was filed on Sep. 4, 2007, and issued on Mar. 30, 2010, as U.S. Pat. No. 7,687,369, which is incorporated by reference herein in its entirety. The present application is also related to co-pending U.S. patent application Ser. No. 11/978,719, entitled, "Method for Forming Hard Mask Patterns Having a Fine Pitch and Method for Forming a Semiconductor Device Using the Same," which is incorporated by reference herein in its entirety.

BACKGROUND OF THE INVENTION

1. Field of the Invention

Embodiments of the present invention relate to a method for manufacturing a semiconductor device. More particularly, embodiments of the present invention relate to a method for forming fine semiconductor patterns device with reduced and varying pitch therebetween using a hard mask in a double patterning process.

2. Description of the Related Art

In general, manufacturing of highly integrated semiconductor devices may require formation of a large number of miniaturized elements, e.g., semiconductor patterns, and integration thereof within a small area. Conventional formation of semiconductor patterns, e.g., interconnect patterns, may be achieved via, e.g., photolithography and film patterning. Integration of semiconductor devices in a small area may require a reduced pitch therebetween, i.e., a reduced sum of a width of one pattern and a width of one space between adjacent patterns.

Reducing a pitch between adjacent semiconductor patterns may be limited when using a photolithography process due to resolution restrictions, e.g., when forming a line and space (L/S) pattern on a substrate. Accordingly, attempts have been made to form semiconductor patterns via a hard mask pattern using a double patterning process, i.e., a process using separate masks to form two patterns. However, the conventional double patterning process for forming patterns with a varying pitch therebetween, e.g., when forming simultaneously a relatively high density pattern in a cell array region and a relatively low density pattern in a peripheral circuit area, may be complex, and may require different etch rates and depths, thereby causing non-uniformities and electrical defects.

Further, when copper (Cu) having a low resistivity is used as a material for fine patterns of a semiconductor, a damascene process may be used, i.e., formation of negative patterns in an insulating material to facilitate deposition of metal in spaces therebetween. However, when conventional double patterning is used to form fine patterns in the insulation material for a subsequent metal deposition, a reduced pitch between adjacent patterns may provide uneven and/or inaccurate pattern profiles, and may potentially trigger a pattern collapse and/or electrical failures. Accordingly, there exists a need for a method of forming a plurality of fine semiconductor patterns with reduced pitch therebetween by way of a double patterning.

SUMMARY OF THE INVENTION

Embodiments of the present invention are therefore directed to a method for forming fine semiconductor patterns, which substantially overcomes one or more of the disadvantages of the related art.

It is therefore a feature of an embodiment of the present invention to provide a method for forming fine patterns of a semiconductor device with a reduced pitch therebetween using a hard mask in a double patterning process.

It is another feature of an embodiment of the present invention to provide a method for simultaneously forming fine patterns of a semiconductor device with a varying pitch therebetween using a hard mask in a double patterning process.

At least one of the above and other features and advantages of the present invention may be realized by providing a method for forming a method for forming fine patterns of a semiconductor device, including forming an etching film on a substrate, the substrate having first and second areas, forming first mask patterns on the substrate, the first mask patterns having a first pattern density in the first area and a second pattern density in the second area, forming first capping patterns between the first mask patterns in the first area, forming second capping patterns between the first mask patterns in the second area, such that recess areas are formed between adjacent second capping patterns, and such that a first etching pattern is defined to include the first and second capping patterns, forming second mask patterns in the recess areas, such that a second etching pattern is defined to include the first and second mask patterns, removing one of the first and second etching patterns, such that a single etching pattern is remaining on the substrate, and etching the etching film using the remaining etching pattern as an etch mask to form etching film patterns.

Forming the first capping patterns, second capping patterns, and second mask patterns may include forming a first capping layer on upper surfaces of and in spaces between the first mask patterns in the first area, forming a second capping layer on the upper surfaces of and in spaces between the first mask patterns in the second area, such that the recess areas are between vertical portions of the second capping layer, forming the second mask layer on upper surfaces of the second capping layer and in the recess areas of the first area, and removing upper portions of the second mask layer, second capping layer, and first capping layer to expose the upper surfaces of the first mask patterns. Removing upper portions of the second mask layer, second capping layer, and first capping layer may include chemical mechanical polishing. Forming the second capping layer may include forming the second capping layer in the second area.

Forming the first capping pattern, second capping pattern, and second mask patterns may include forming a third capping layer on upper surfaces of and in spaces between the first mask patterns, such that recess areas are formed between the first mask patterns in the second area, forming the second mask layer on the third capping layer, removing the second mask layer from the first area, so a portion of the second mask layer is remaining in the second area, forming a fourth capping layer on the third capping layer and in the recess areas of the first area, and removing upper portions of the third capping layer, fourth capping layer, and second mask layer to expose the upper surfaces of the first mask patterns. Removing upper portions of the third capping layer, fourth capping layer, and second mask layer may include chemical mechanical polishing. The third capping layer may be formed only in the second area. The third capping layer may be formed in each of the first and second areas and the fourth capping layer may be formed in the first area to form the first capping pattern The etching film may be formed of an insulation material or a conductive material. The first and second mask patterns may be formed of polysilicon. The first and second capping patterns may be formed of an oxide and/or a nitride. The method may further include forming an over etching buffer layer on the etching film in the first and second areas before forming the first mask patterns, so the first mask patterns are formed on the over etching buffer layer. Forming the first mask patterns may include forming a first mask layer on the over etching buffer layer in the first and second areas, and forming a first mask pattern and an over etching buffer layer pattern having a first pattern density and a second pattern density in the first and second areas, respectively, by patterning the first mask layer and the over etching buffer layer. The over etching buffer layer may be formed of a material having the same etching selectivity as that of the material for the second capping layer pattern. The over etching buffer layer may be formed of a silicon nitride or a silicon oxide.

The method may further include forming a hard mask layer on the etching film before the first mask pattern is formed, and forming a hard mask pattern by etching the hard mask layer using the remaining etching pattern as an etch mask, wherein the remaining etching pattern and the hard mask pattern are used as etch masks to etch the etching film. The hard mask layer may be formed of one or more of an oxide, a nitride, a silicon oxynitride, and/or an amorphous carbon layer. The etching film may be an insulation film, and the method may further include forming a metal film in spaces between the etching film patterns. The metal film may be formed of copper, tungsten, and/or aluminum. The etching film may be a conductive film, and the second etching pattern may be used as an etch mask to etch the etching film.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
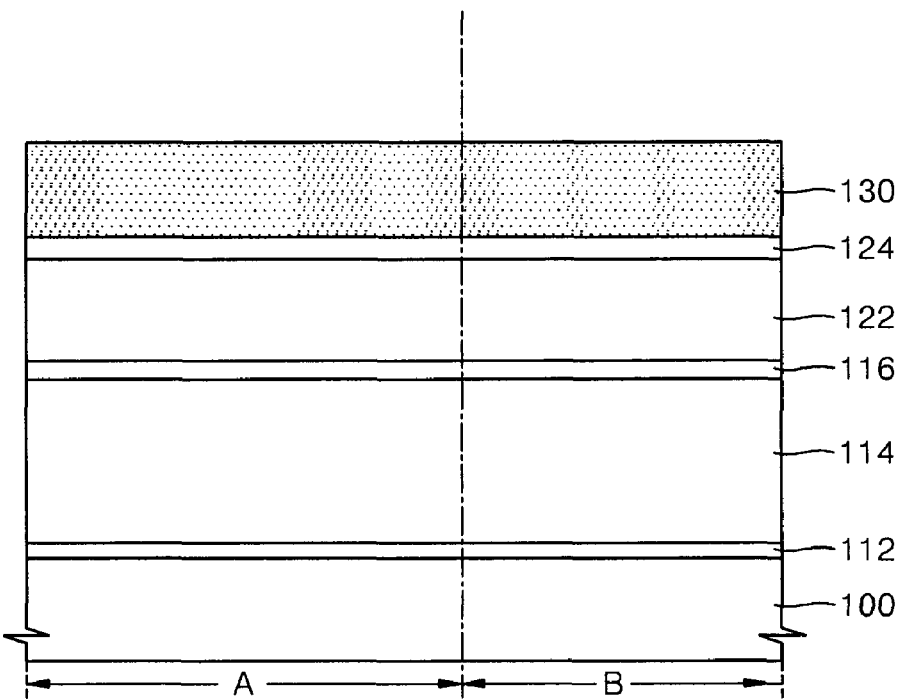
FIGS. 1A-1K illustrate partial cross-sectional views of a semiconductor device during sequential stages in a method for forming fine patterns thereof according to an embodiment of the present invention.

Korean Patent Application No. 10-2007-0065658, filed on Jun. 29, 2007, in the Korean Intellectual Property Office, and entitled: "Method for Forming Fine Pattern of Semiconductor Device Using Double Patterning Process," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a method for forming fine patterns, e.g., interconnect patterns, of a semiconductor device of the present invention will now be described more fully with reference to FIGS. 1A-1K.

Referring to FIG. 1A, a first etching prevention layer 112, an etching film 114, and a second etching prevention layer 116 may be sequentially formed on a substrate 100. However, other configurations, e.g., using the etching film 114 on the substrate 100 with only one of or neither of the first and second etching prevention layers 112 and 116, are within the scope of the present invention.

The substrate 100 may be any suitable semiconductor substrate, e.g., a silicon substrate. A plurality of unit devices (not shown), e.g., a transistor, may be formed on the substrate 100. An interlayer insulation film (not shown) covering the unit devices may be formed on the substrate 100. Also, a plurality of conductive areas (not shown) may be electrically connected to the unit devices through the interlayer insulation film, and may be exposed on the substrate 100.

The substrate 100 may include a low density pattern area A and a high density pattern area B. The low density pattern area A may be an area having a relatively low pattern density per unit area, e.g., a peripheral circuit area, a core area, a portion of a cell array region having a low pattern density, and so forth. The high density pattern area B may be an area having a higher pattern density per unit area than the low density pattern area A, e.g., a portion of a cell array region having patterns with smaller pitch therebetween than patterns in the low density pattern area A.

The first etching prevention layers 112 may function as an etch stopper during etching of the etching film 114, and may be formed of a material having a different etching selectivity with respect to a material used for forming the etching film 114. For example, the first etching prevention layer 112 may be formed on the substrate 100 of one or more of silicon nitride, silicon oxynitride, and/or silicon carbide to a thickness of about 400 angstroms to about 500 angstroms.

The etching film 114 may be formed on the first etching prevention layer 112 of a conductive material, e.g., to form a plurality of conductive patterns or pads, or of an insulating material. Examples of conductive materials may include one or more of metal, metal nitride, and/or a semiconducting material. Examples of insulating materials may include materials having a relatively low dielectric constant, e.g., one or more of tetraethyl orthosilicate (TEOS), fluorine silicate glass (FSO), silicon oxycarbide (SiOC), and/or silicon with a low-k (SiLK).

The second etching prevention layer 116 may be formed on the etching film 114 as an etch stopper during a subsequent etching of a hard mark pattern, as will be explained in more detail below with reference to FIG. 1J. The second etching prevention layer 116 may be formed of a same material as the first etching prevention layer 112 or of a different material, and may have a different etching selectivity with respect to a material used for forming the etching film 114, e.g., silicon nitride, silicon oxynitride, silicon carbide, and/or a polysilicon. The second etching prevention layer 116 may have a thickness of about 400 angstroms to about 500 angstroms.

As further illustrated in FIG. 1A, a hard mask layer 122 and an over-etching buffer layer 124 may be sequentially formed on the second etching prevention layer 116. The hard mask layer 122 may be formed of any suitable material, as may be determined with respect to etch selectivity thereof relative to the etching film 114 and to a type of patterns to be formed. For example, the hard mask layer 122 may be formed of one or more of an oxide, e.g., a thermal oxide film, a chemical vapor deposition (CVD) oxide film, an undoped silicate glass (USG) film, a high density plasma (HDP) oxide film, and so forth, a nitride, e.g., silicon nitride (SiN), silicon boron nitride (SiBN), boron nitride (BN), and so forth, a silicon oxynitride (SiON), and/or an amorphous carbon layer (ACL).

The over-etching buffer layer 124 may be deposited on the hard mask layer 122 to prevent a potential damage to the hard mask layer 122 and to remove residues in subsequent processes, e.g., etching. The over-etching buffer layer 124 may be formed of a material exhibiting a substantially similar etching selectivity to a second capping layer 142, as will be explained in more detail below with respect to FIG. 1H. The over-etching buffer layer 124 may be formed of, e.g., silicon nitride or silicon oxide.

As further illustrated in FIG. 1A, a first mask layer 130 may be formed on the over-etching buffer layer 124. The first mask layer 130 may be formed of a material having different etch selectivity as compared to the hard mask layer 122. In other words, even though the first mask layer 130 may be formed of polysilicon, oxygen, or nitride, e.g., SiON, SiN, SiBN, and/or BN, a same material may not be used to form both the first mask layer 130 and the hard mask layer 122. For example, when the hard mask layer 122 is formed of a nitride film or ACL, the first mask layer 130 may be formed of an oxide film or a polysilicon film. In another example, when the hard mask layer 122 is formed of an oxide film, the first mask layer 130 may be formed of a polysilicon film.

Figure 1B:
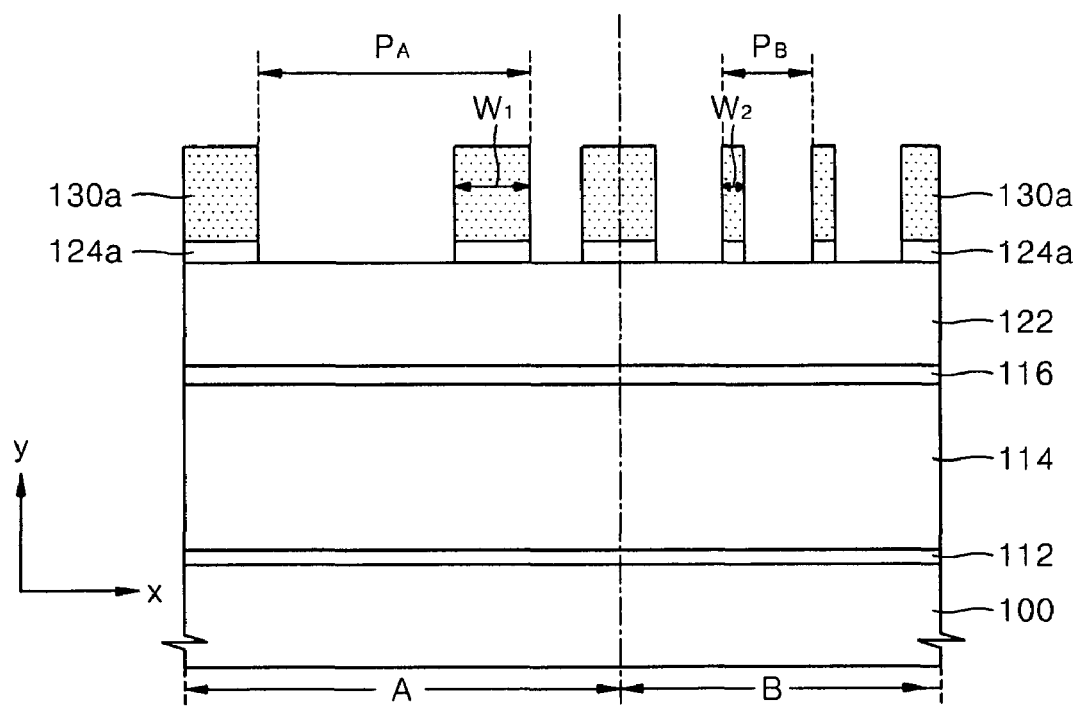

Referring to FIG. 1B, a first mask pattern 130a and an over-etching buffer pattern 124a may be formed on the hard mask 122 by patterning, e.g., via a photolithography process, the mask layer 130 and the over-etching buffer layer 124, respectively. More specifically, portions of the mask layer 130 and the over-etching buffer layer 124 may be removed to form a plurality of patterns, e.g., a plurality of lines in a predetermined direction or a rectangular pattern as viewed from a plane, in both the low and high density pattern areas A and B of the substrate 100.

In the low density pattern area A of the substrate 100, the first mask patterns 130a may have a plurality of patterns having a first width W1, and may have a first pitch $P_A$ between adjacent patterns. In the high density pattern area B of the substrate 100, the first mask patterns 130a may have patterns having a second pitch $P_B$ between adjacent first mask patterns. A pattern of the first mask patterns 130a may have a second width W2. A width of the second pitch $P_B$ may substantially equal about ½ of a width of the first pitch $P_A$. The second width W2 may equal about ¼ of the second pitch $P_B$. In this respect, it is noted that a "pitch" hereinafter refers to a sum of a width of a single pattern portion and a width of a single gap between two adjacent patterns, e.g., the second pitch $P_B$ may refer to a sum of the second width W2 and a width of a gap between two adjacent patterns of the first mask patterns 130A, as illustrated in FIG. 1B. A "width" hereinafter refers to a distance as measured along the x-axis.

Figure 1C:
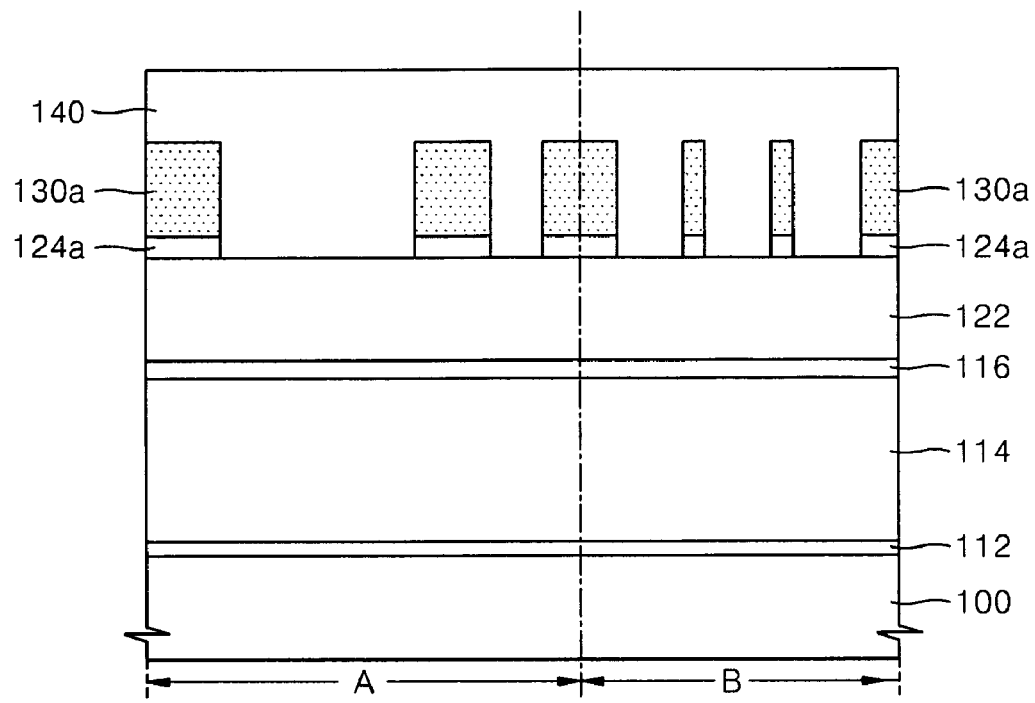

Referring to FIG. 1C, a first capping layer 140 may be formed on the hard mask layer 122. More specifically, the first capping layer 140 may be deposited on the hard mask layer 122 to completely fill spaces between first mask patterns 130a and over-etching buffer layer patterns 124a in the low and high density pattern areas A and B, and to coat upper surfaces, i.e., surfaces facing away from the substrate 100, thereof. The first capping layer 140 may be formed of, e.g., an oxide, a nitride, an ACL, and/or silicon.

Figure 1D:
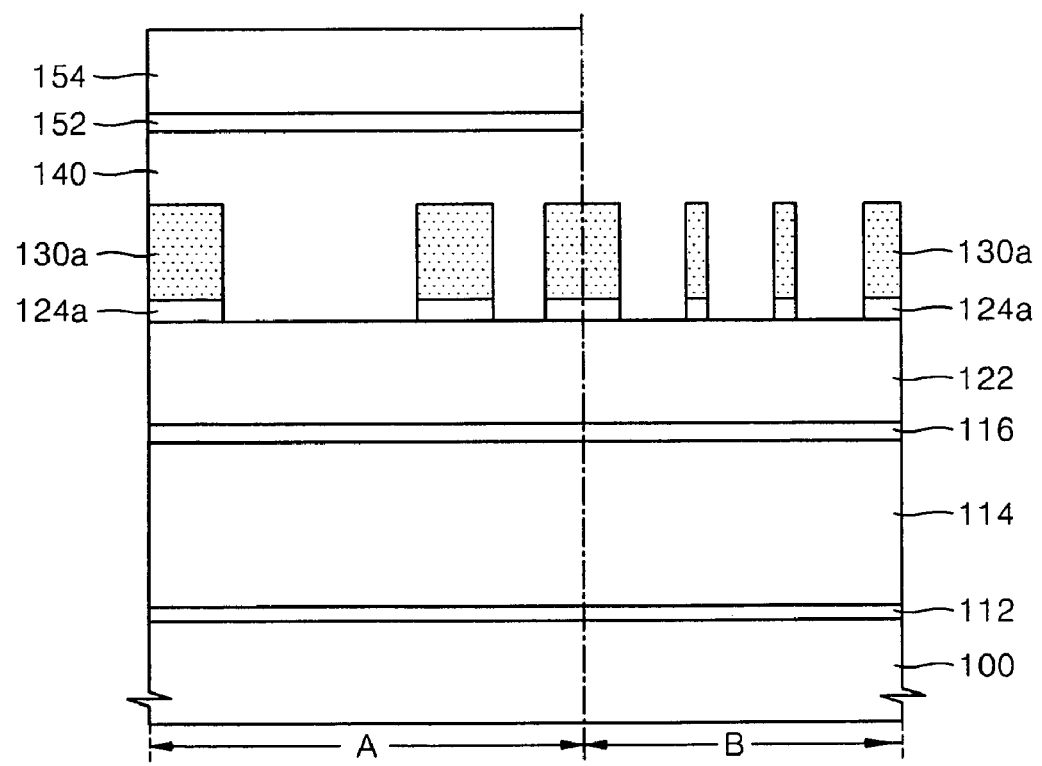
Figure 1E:
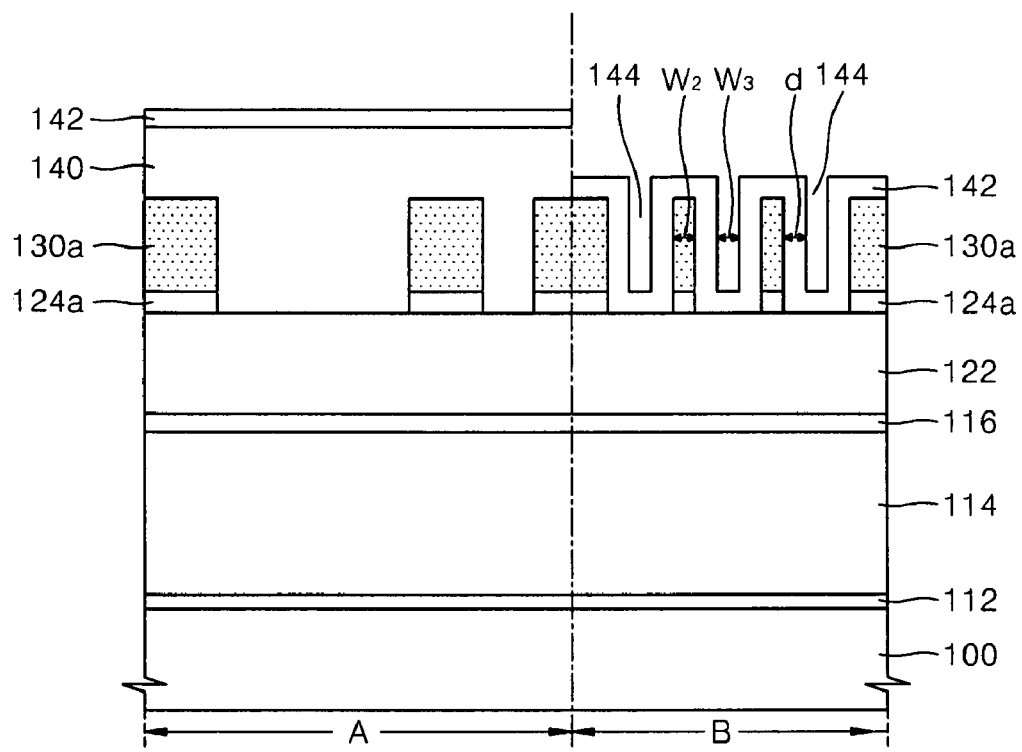
Figure 1F:
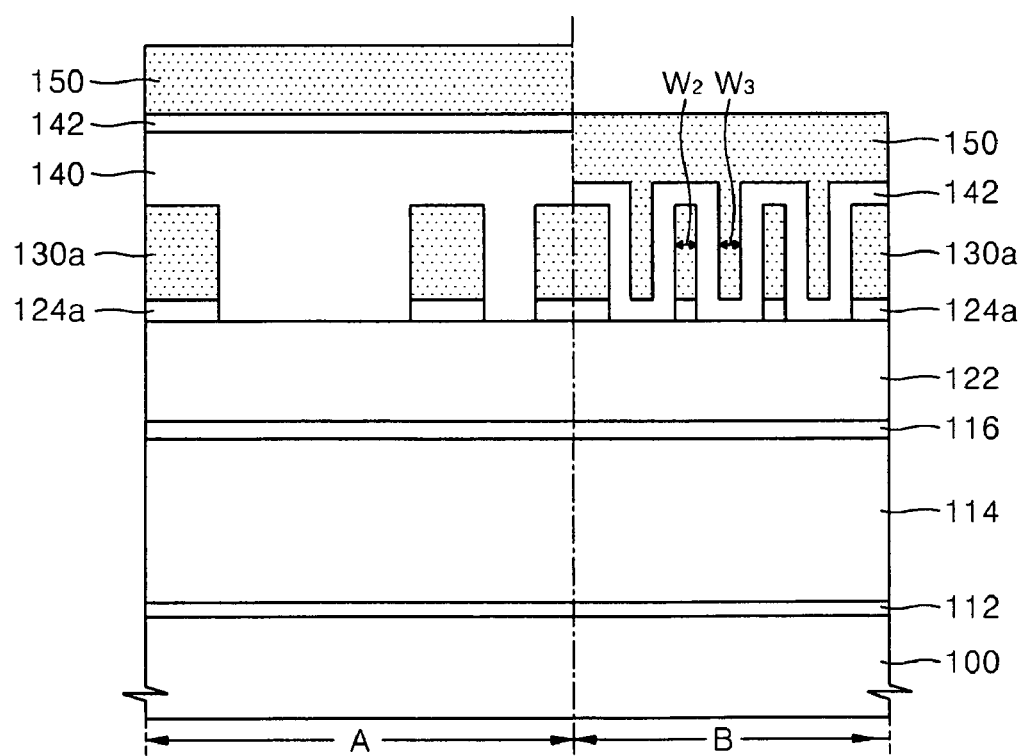
Figure 1G:
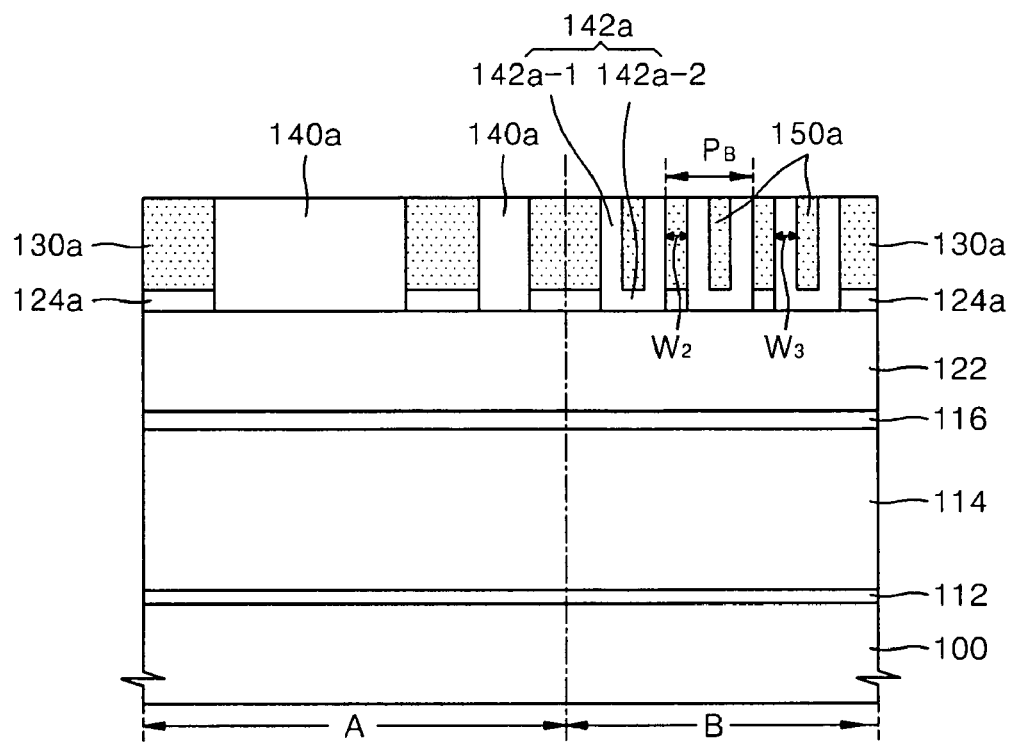
Figure 1H:
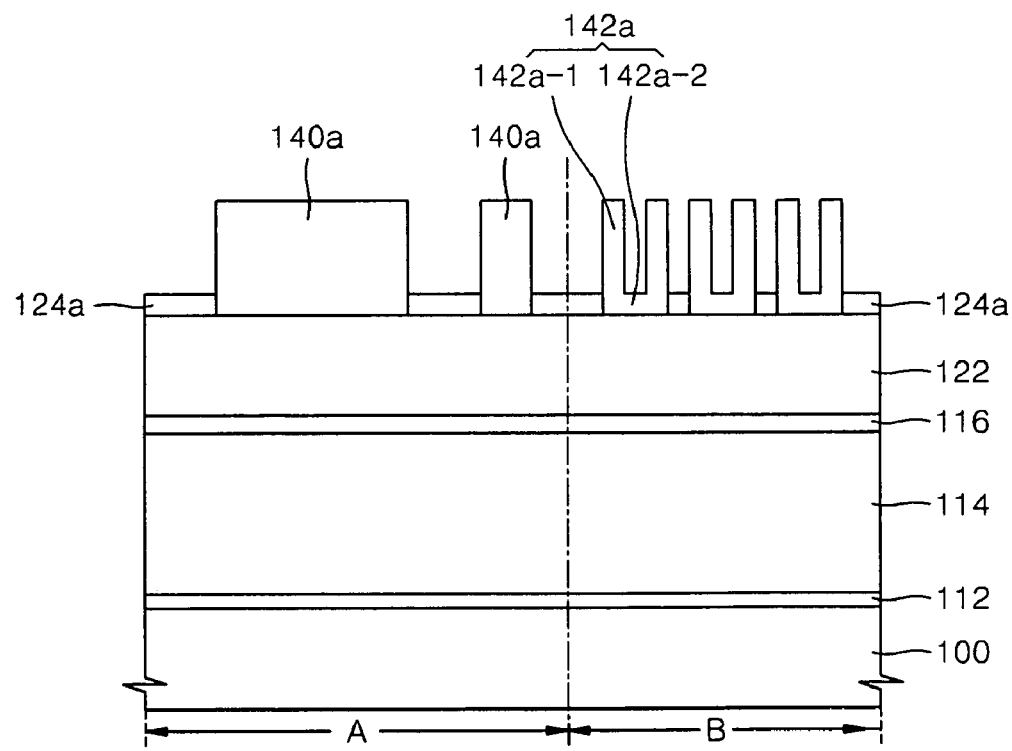
Figure 1I:
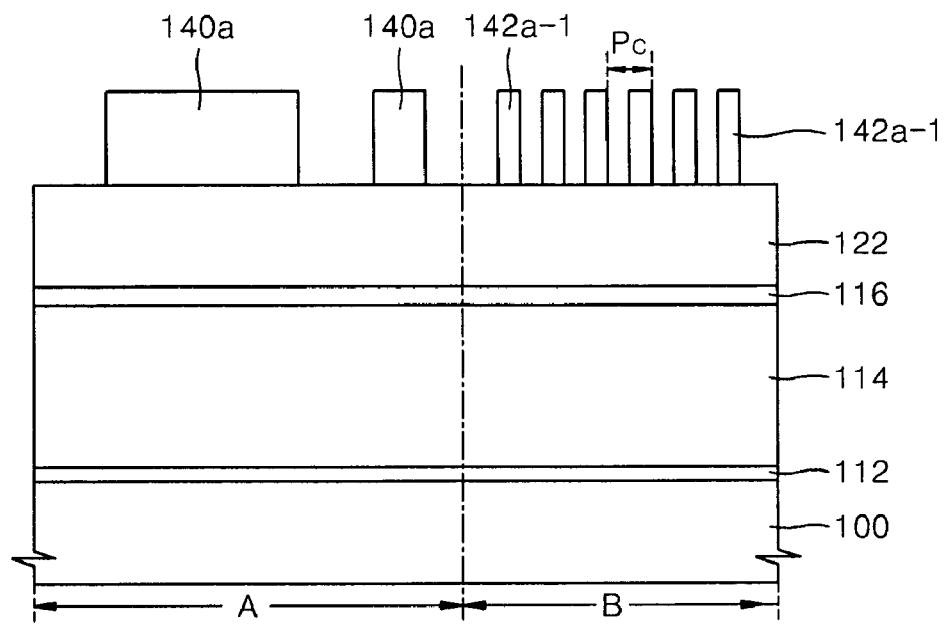
Figure 1J:
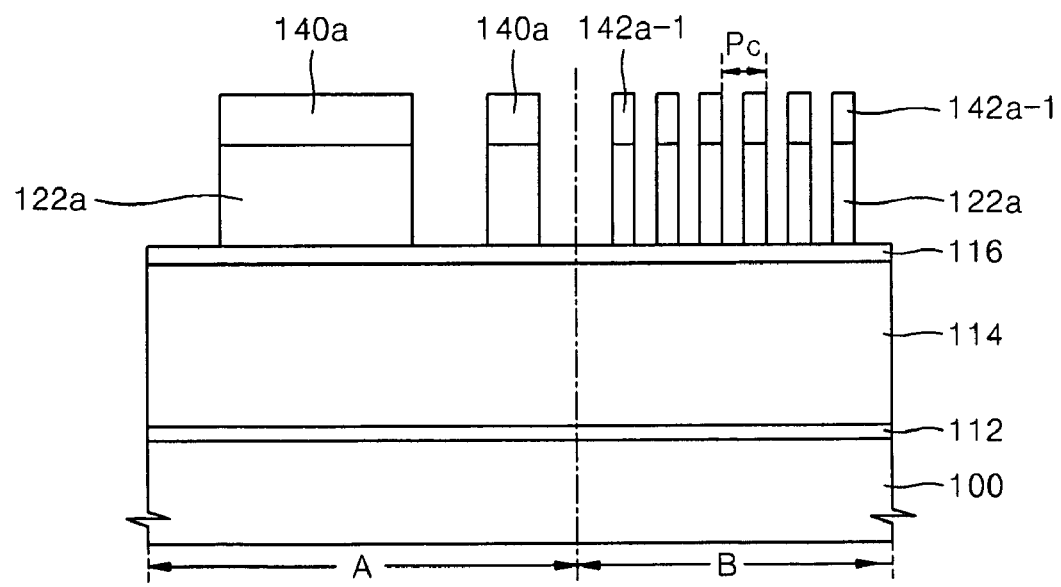

If the first capping layer 140 is subsequently used as an etching mask to etch the hard mask layer 122, e.g., as illustrated in FIGS. 1J-1I, the material of the first capping layer 140 may have a different etch selectivity with respect to the hard mask layer 122. For example, when the hard mask layer 122 is formed of a nitride, the first capping layer 140 may be formed of an oxide, and vice versa. However, if the first capping layer 140 is not used as an etching mask to etch the hard mask layer 122, e.g., the first mask patterns 130a may be used as an etching mask to etch the hard mask layer 122, the material of the first capping layer 140 may have a substantially similar etching selectivity as that of the hard mask layer 122.

Referring to FIG. 1D, a reflection prevention film 152 and a photoresist pattern 154 may be sequentially deposited on the first capping layer 140 in the low density pattern area A of the substrate 100. An upper surface of the first capping layer 140 may be exposed only in the high density pattern area B, i.e., the reflection prevention film 152 and the photoresist pattern 154 may completely cover the upper surface of the first capping layer 140 in the low density pattern area A. Next, the first capping layer 140 may be etched using the photoresist pattern 154 as an etch mask, by, e.g., a reactive ion etching (RIE) process, so that the first capping layer 140 may be completely removed from the high density pattern area B to expose portions of an upper surface of the hard mask layer 122 between adjacent first mask patterns 130a. A portion of the first capping layer 140 may remain in the low density pattern area A between the first mask patterns 130a.

During removal of the first capping layer 140 from the high density pattern area B, over etching may be performed to prevent or substantially minimize formation of a residue of the first capping layer 140 on, e.g., the high density first mask pattern 130b or a corner portion of the upper surface of the substrate 100 in the high density pattern area B. More specifically, the over etching buffer layer 124 may be used to provide sufficient process margin during etching of the first capping layer 140, so the etching process may remove the entire first capping layer 140 from the high density pattern area B. As a result, no residue of the first capping layer 140 may be left in the high density pattern area B, thereby eliminating a need of using, e.g., a separate wet etching process to remove residue, and minimizing potential damage to a lower structure or peripheral films of the semiconductor device.

A portion of the first capping layer 140 may remain in the low density pattern area A of the substrate 100 in order to prevent double patterning in the low density pattern area A. In this respect, it should be noted that the first capping layer 140 may remain in any predetermined area of either of the low density pattern area A or the high density pattern area B. In other words, a portion of the first capping layer 140 may completely fill a space between any two adjacent first mask patterns 130a, as may be determined by design requirements and specifications, in order to block double patterning therein.

Referring to FIG. 1E, once the first capping layer 140 is removed from the high density pattern area B, the reflection prevention film 152 and the photoresist pattern 154 may be removed from the remaining portion of the first capping layer 140 in the low density pattern area A. Next, a second capping layer 142 may be deposited in the high and low density pattern areas A and B to have a substantially uniform thickness. More specifically, the second capping layer 142 may be deposited on the mask pattern 130a in the high density pattern area B and on the first capping layer 140 in the low density pattern area A. In the high density pattern area B, the second capping layer 142 may be deposited to coat outer surfaces, i.e., sidewalls and upper surfaces, of the first mask patterns 130a and the exposed upper surface of the hard mask layer 122, as further illustrated in FIG. 1E.

The second capping layer 142 in the high density pattern area B may be formed to have a thickness d, so that recess areas 144 having a third width W3 may be formed between adjacent first mask patterns 131a therein. More specifically, each recess area 144 may be defined between outer surfaces of two adjacent vertical portions of the second capping layer 142, i.e., portions of the second capping layer 144 coated on sidewall surfaces of adjacent and facing first mask patterns 130a. The thickness d of the second capping layer 142 may be adjusted, so that the third width W3 of each recess area 144 may substantially equal the second width W2 of each first mask pattern 130a.

The second capping layer 142 may be formed of a material having an etch selectivity that may be substantially similar to the first capping layer 140. For example, the first and second capping layers 140 and 142 may be formed of a substantially same material. In another example, the second capping layer 142 may be, e.g., an oxide film, and the first capping layer 140 may be formed of a different material having a substantially similar etch selectivity as the oxide film of the second capping layer 142. The second capping layer 142 may be formed of a material having an etch selectivity that may be substantially similar to the etch selectivity of the over-etching buffer layer pattern 124a. The second capping layer 142 may be formed of, e.g., an oxide or a nitride, by an atomic layer deposition (ALD) method.

Referring to FIG. 1F, a second mask layer 150 may be formed on the second capping layer 142 in the high and low density pattern areas A and B. In the high density pattern area B, the second mask layer 150 may be formed on the second capping layer 142 to completely fill the recess areas 144 and coat upper surface of the second capping layer 142. Accordingly, portions of the second mask layer 150 formed in the recess areas 144 may have the third width W3. The second mask layer 150 may be formed of a material having a substantially similar etch selectivity with respect to the first mask layer 130. For example, both the first and second mask layers 150 and 130 may be formed of a polysilicon film. In another example, the first mask layer 130 may be formed of a nitride, while the second mask layer 150 may be formed of polysilicon film, and vice versa. The second width W2 of each of the first mask pattern 130a may be substantially equal to the third width W3 of each of the portions of the second mask layer 150 in the recess areas 144, so a pitch between adjacent portions of the second mask layer 150 filling the recess areas 144 may be substantially equal the second pitch $P_B$.

Referring to FIG. 1G, a second mask pattern 150a may be formed in the recess areas 144, i.e., between adjacent first mask patterns 130a in the high density pattern area B. More specifically, the second mask layer 150 may be leveled, e.g., by a chemical mechanical polishing (CMP) process, to remove an upper portion thereof to expose an upper surface of the high density first mask pattern 130b. Accordingly, a plurality of second mask pattern portions 151b of the second mask pattern 150a may be formed in the recess areas 144 to have the second pitch $P_B$ therebetween, and may be positioned in an alternating pattern with the first mask patterns 130a, as further illustrated in FIG. 1G.

During removal of the upper portion of the second mask layer 150 in the high density pattern area B in order to expose upper surfaces of the first mask pattern 130a, an upper portion of the second capping layer 142 may be removed to form a second capping layer pattern 142a. A thickness of the portion removed from the second capping layer 142 may be adjusted so upper surfaces of the second capping layer pattern 142 and the first and second mask patterns 130a and 150a may be aligned, i.e., extend to a substantially same height with respect to the hard mask layer 122. In other words, the second capping layer 142 may form an alternating line pattern with the first and second mask patterns 130a and 150a in a same direction and to a substantially same height.

The second capping layer patterns 142a may include vertical pattern portions 142a-1 and horizontal pattern portions 142a-2, so two vertical pattern portions 142a-1 and one horizontal pattern portion 142a-2 therebetween may have a U-shape. As such, the second capping layer 142 may include a plurality of "U-shapes" positioned along the hard mask layer 122, so each second mask pattern 150a may be positioned in a corresponding recess area 144 on a corresponding horizontal pattern portion 142a-2 of the second capping layer pattern 142a. Each second mask pattern 150a may be positioned between two vertical pattern portions 142a-1, i.e., inside the "U-shape," and each vertical pattern portion 142a-1 may be between a first mask pattern 130a and a second mask pattern 150a. The thickness d of the second capping layer 142 may be adjusted to substantially equal about ¼ of the second pitch $P_B$, so a width of each of the vertical pattern portions 142a-1 may substantially equal the second width W2 of the first mask pattern 130a.

Similarly, as further illustrated in FIG. 1G, the second mask layer 150 may be leveled in the low density area A, followed by removal of the second capping layer 142 and upper portion of the remaining portion of the first capping layer 140 to expose upper surfaces of the first mask patterns 130a in the low density pattern area A, so a first capping layer pattern 140a may be formed. Portions of the first capping layer pattern 140a may be positioned between adjacent first mask patterns 131a.

Referring to FIG. 1H, the first and second mask patterns 130a and 150a may be removed, e.g., by dry or wet etching process, using the first and second capping layer patterns 140a and 142a as etch masks. After the first and second mask patterns 130a and 150a are removed, an upper surface of the over-etching buffer layer pattern 124a may be exposed in the low and high density pattern areas A and B.

Referring to FIG. 1I, the over-etching buffer layer pattern 124a may be removed using, e.g., an anisotropic dry etching process. Since the over-etching buffer layer pattern 124a may be formed of a material having a substantially same etch selectivity as the second capping layer pattern 142a, the horizontal pattern portions 142a-2 may be removed with the over-etching buffer layer pattern 124a to expose an upper surface of the hard mask layer 122. As a result, a plurality of vertical pattern portions 142a-1 having a third pitch $P_C$ therebetween may be formed in the high density pattern area B. The third pitch $P_C$ may substantially equal about ½ of the second pitch $P_B$. The first capping layer pattern 140a may be left in the low density pattern area A. An upper portion of each of the vertical pattern portions 142a-1 and the first capping layer pattern 140a, i.e., a portion having a substantially same thickness as the over-etching buffer layer pattern 124a and the horizontal pattern portions 142a-2, may be removed.

Referring to FIG. 1J, hard mask patterns 122a may be formed by anisotropic dry etching of the hard mask layer 122. More specifically, the vertical pattern portions 142a-1 and the first capping layer patterns 140a may be used as etch masks to remove portions of the hard mask layer 122. The second etching prevention layer 116 may be used as an etch stopper. During etching of the hard mask layer 122, upper portions of the vertical pattern portions 142a-1 and capping layer pattern 140a may be partially removed, as further illustrated in FIG. 1J.

Figure 1K:
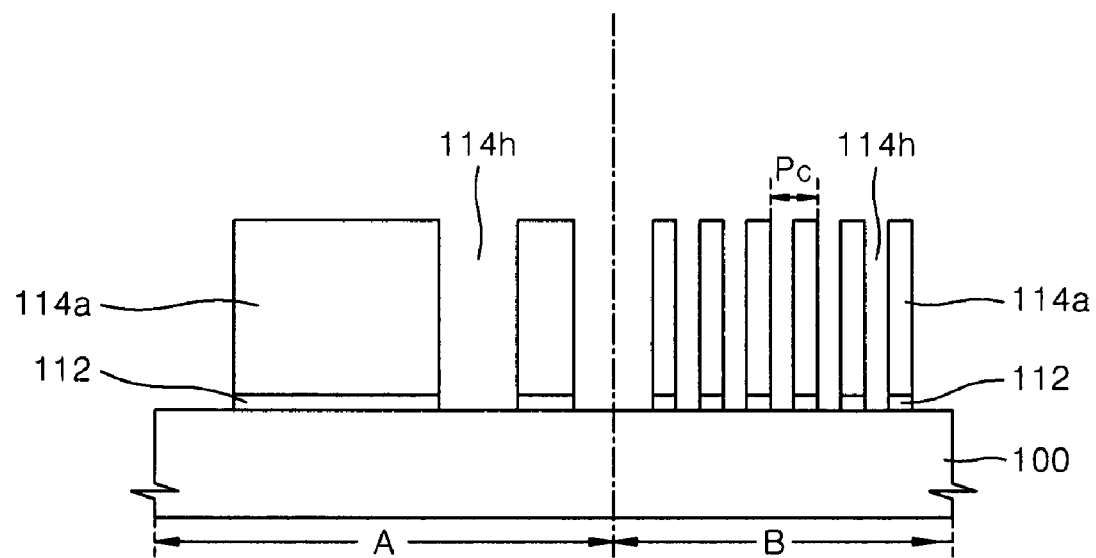

Referring to FIG. 1K, etching film patterns 114a having a plurality of openings 114h therebetween may be formed in low and high density pattern areas A and B by anisotropic dry etching of the second etching prevention layer 116 and the etching film 114 using the second capping layer vertical portions 142a-1, first capping layer patterns 140a, and hard mask patterns 122a as etching masks. The first etching prevention layer 112 may be used as an etch stopper.

An upper surface of the substrate 100 may be exposed by removing portions of the first etching prevention layer 112 in the openings 114h of the etching film pattern 114a. Then, the second etching prevention layer 116, hard mask patterns, 122a, vertical portions 142a-1, and first capping layer patterns 140a may be removed to finalize formation of the etching film patterns 114a.

As illustrated in FIG. 1K, the etching film patterns 114a may have varying pitch widths therebetween. More specifically, un the high density pattern area B, the etching film patterns 114a may have the third pitch $P_C$ therebetween, and in the low density pattern area A, the etching film patterns 114a may have the first pitch $P_A$ therebetween. When the etching film 114 is formed of a conductive layer or a semiconductor, the etching film patterns 114a may form, e.g., a wiring line for a semiconductor device.

It should be noted that even though fine patterns of a semiconductor device according to an embodiment of the present invention may be formed by using the first capping layer pattern 140a and the vertical pattern portions 142a-1 as etch masks to etch underlying layers, other etching methods are within the scope of the present invention. For example, the first capping layer pattern 140a and the vertical pattern portions 142a-1 may be removed from the structure illustrated in FIG. 1G, so the first and second mask patterns 130a and 150a may be used as etch masks, thereby forming a fine pattern having a shape of a reverse tone with respect to the pattern illustrated in FIG. 1K.

A semiconductor device formed according to an embodiment described with reference to FIGS. 1A-1K may have fine patterns with varying pitch widths therebetween formed simultaneously on the same substrate. Such patterns may be formed to have different pattern density and/or width by forming the first and second mask patterns 130a and 150a in a double patterning process in a predetermined region of the substrate 100. Further, an over-etching buffer layer 124 may be used to prevent or substantially minimize residue of the first and/or second capping layers 140 and 142 on the substrate 100 during the double patterning process of the first and second mask patterns 130a and 150, thereby eliminating disadvantages due different etch rate and depth in the double patterning process.

Figure 2A:
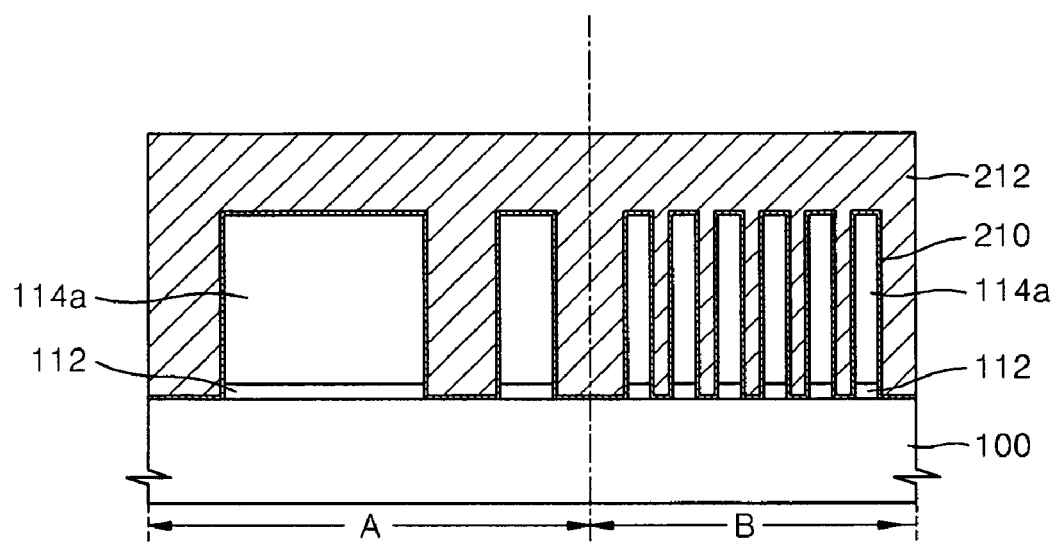
FIGS. 2A-2B illustrate partial cross-sectional views of a semiconductor device during sequential stages in a method for forming fine patterns thereof according to another embodiment of the present invention.
Figure 2B:
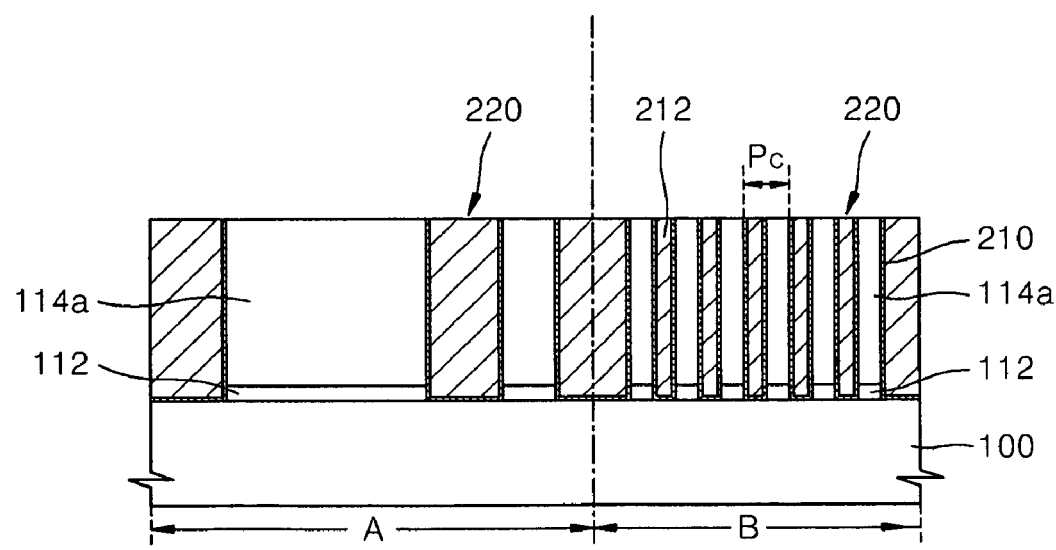

According to another exemplary embodiment illustrated in FIGS. 2A-2B, the film etching patterns 114a may be formed according to a substantially same method described previously with reference to FIGS. 1A-1K, with the exception of forming the etching film patterns 114a of an insulation material, so a metal film 212 may be deposited in the openings 14h between the etching film patterns 114a to form metal wires via a damascene process. A barrier film 210 may be formed between the etching film patterns 114a and the metal film 212.

The barrier film 210 may be coated on outer surfaces of the film patterns 114a and on exposed portions of the upper surfaces of the substrate 100 in order to prevent diffusion of metal atoms of the metal film 212 into the film pattern 114a. The barrier film 210 may be formed to have a thickness of about several angstroms to about several hundreds of angstroms, and may be determined according to a width and a depth of the openings 114h. For example, the barrier film 210 may have a thickness of about 5 angstroms to about 150 angstroms. The barrier film 210 may be formed of one or more of tantalum (Ta), tantalum nitride (TaN), titanium nitride (TiN), tantalum silicon nitride (TaSiN), and/or titanium silicon nitride (TiSiN) by, e.g., a chemical vapor deposition (CVD) process or a sputtering process. Forming of the barrier film 210 may be optional.

The metal film 212 may be formed of one or more of, e.g., copper (Cu), tungsten (W), and/or aluminum (Al), by a physical vapor deposition (PVD) process and/or an electroplating process. For example, a first Cu film may be formed on the barrier film 210 by the PVD process to form a single layer metal film 212. Alternatively, the first Cu film may be used as a seed layer to form a second Cu film on the first Cu film via the electroplating process to form a double layer metal film 212. When forming a double layer metal film 212, the first Cu film may provide a seed for generating a nucleus for a subsequent electroplating process, thereby improving uniformity of the second Cu film on the first Cu film. The first Cu film may have a thickness of, e.g., about 100 angstroms to about 500 angstroms. A thickness of the second Cu film may be adjusted to completely fill the openings 114h, e.g., about 1,000 angstroms to about 10,000 angstroms.

Referring to FIG. 2B, upper portions of the metal film 212 and the barrier film 210 may be partially removed to expose upper surface of the etching film patterns 114a. A plurality of metal wiring lines 220 may be formed between the etching film patterns 114a, so upper surfaces of the wiring lines 220 and etching film patterns 114a may be aligned. The wiring lines 220 may include portions of the barrier film 210 and metal film 212, and may have the third pitch $P_C$ therebetween.

To remove parts of the metal film 212 and barrier film 210, the CMP process or a wet etching process may be used. When the metal film 212 is formed of a Cu film, an etching solution formed of, e.g., hydrogen fluoride (HF), hydrogen peroxide ($H_2O_2$), and water ($H_2O$) at a volumetric ratio of about 1:1:50 to about 5:5:300, may be used in a wet etching process. Alternatively, the metal film 212 may be removed by a wet etching solution formed of, e.g., sulfuric acid ($H_2SO_4$) and peroxide ($H_2O_2$) at a volumetric ratio of about 2:1 to about 10:1, may be used. When the barrier film 210 is formed of Ta, TaN, or a combination thereof, an etching solution formed of, e.g., ammonia ($NH_3$), peroxide ($H_2O_2$), and water ($H_2O$) at a volumetric ratio of about 1:1:5 to about 5:5:30, may be used.

The wet etching process to remove parts of the metal film 212 and barrier film 210 may be performed at room temperature. The wet etching process may be used with a dry etching process, so part of the metal film 212 may be removed by the wet etching process and part of the barrier film 210 exposed by the wet etching process may be removed by the dry etching process. When the barrier film 210 is formed of Ta, TaN, or a combination thereof, a plasma type dry etching process may be performed using, e.g., chloride ($Cl_2$) and boron chloride ($BCl_3$), as etching gases.

Formation of the wiring lines 220 according to embodiments of the present invention may be advantageous in providing metal wiring lines having fine and varying widths of pitch formed via a damascene process, i.e., metal material deposited between insulating depressed patterns formed via a double patterning process and having a substantially same layout as the wiring lines 220. Thus, formation of the metal wiring lines 220, e.g., Cu interconnecting lines, according to embodiments of the present invention may facilitate formation of a plurality of alternating metal and insulating patterns via a single design layout. In other words, since designing a separate layout for forming a depressed engraving pattern, i.e., formation of negative patterns, may not be needed for the damascene process, metal wiring patterns may be formed by depositing a conductive material directly into the negative patterns, thereby facilitating formation of wiring patterns with varying pitch widths therebetween via a damascene process.

According to yet another exemplary embodiment illustrated in FIGS. 3A-3F, a method for forming fine patterns may be substantially similar to the method described previously with reference to FIGS. 1A-1K, with the exception of forming a fourth capping layer 370, i.e., an equivalent of the first capping layer 140, after forming the second mask pattern 350a.

Figure 3A:
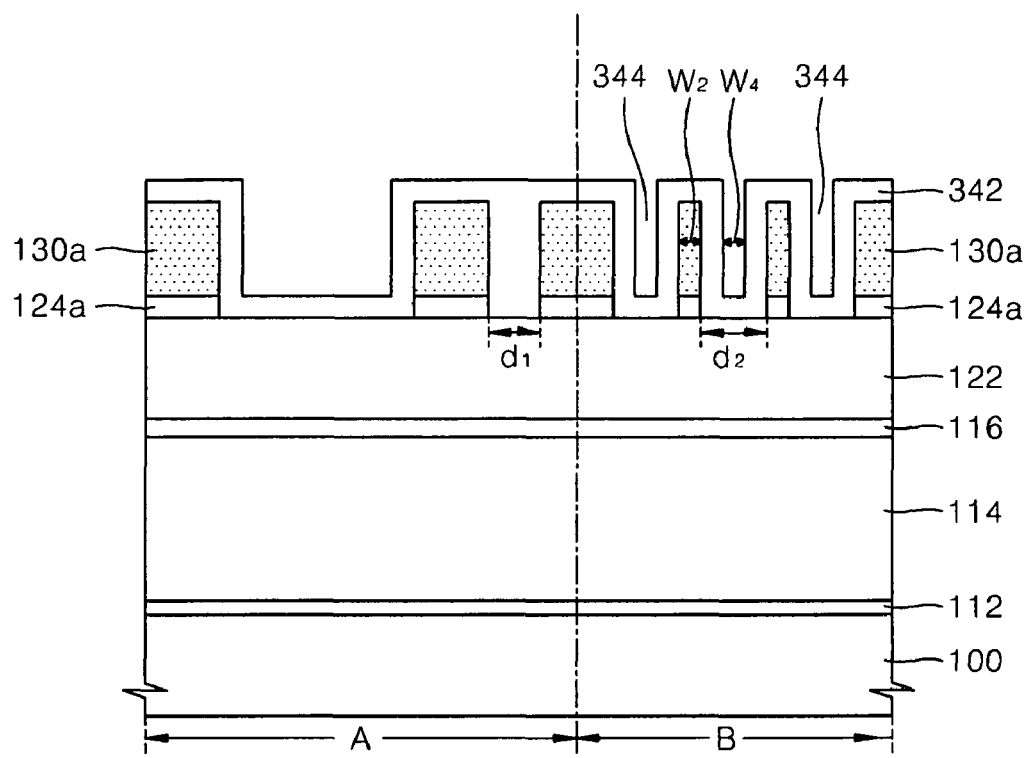
FIGS. 3A-3F illustrate partial cross-sectional views of a semiconductor device during sequential stages in a method for forming fine patterns thereof according to another embodiment of the present invention.

Referring to FIG. 3A, initial stages in the method according to an embodiment of the present invention may be substantially similar to the stages of the method described previously with reference to FIGS. 1A-1B. Once the first mask patterns 130a and over-etching buffer layer patterns 124a are formed on the substrate 100, a third capping layer 342 may be formed on the first mask patterns 130a, and on portions of exposed upper surface of the hard mask layer 122 to a substantially uniform thickness. A part of the third capping layer 342 in the low density pattern area A may be removed (not shown).

The third capping layer 342 may be deposited to cover outer surfaces, i.e., sidewalls and/or upper surfaces, of the first mask patterns 130a and the exposed upper surfaces of the hard mask layer 122. The third capping layer 342 may be formed to have a predetermined thickness, so that recess areas 344 having a fourth width W4 may be formed on an upper surface of the third capping layer 342 and between vertical portions thereof in the high density pattern area B, as illustrated in FIG. 3A. The predetermined thickness of the third capping layer 342 may be adjusted, so that the fourth width W4 may substantially equal the first width $W_1$ of the first mask pattern 130a.

It should be noted, however, that when a gap between two adjacent first mask patterns 130a, e.g., a first distance $d_1$ in FIG. 3A, is smaller than the second distance $d_2$, i.e., a width of a gap between two adjacent first mask patterns 130a in the high density pattern area B along the x-axis, the recess area 344 may not be formed. In other words, when the first distance $d_1$ is smaller than the second distance $d_2$, the third capping layer 342 may fill completely the space between the corresponding mask patterns, as illustrated in FIG. 3A. Other structural details of the third capping layer 342 may be substantially similar to those of the second capping layer 142 described previously with reference to FIG. 1E, and therefore, its detailed description will not be repeated herein.

Figure 3B:
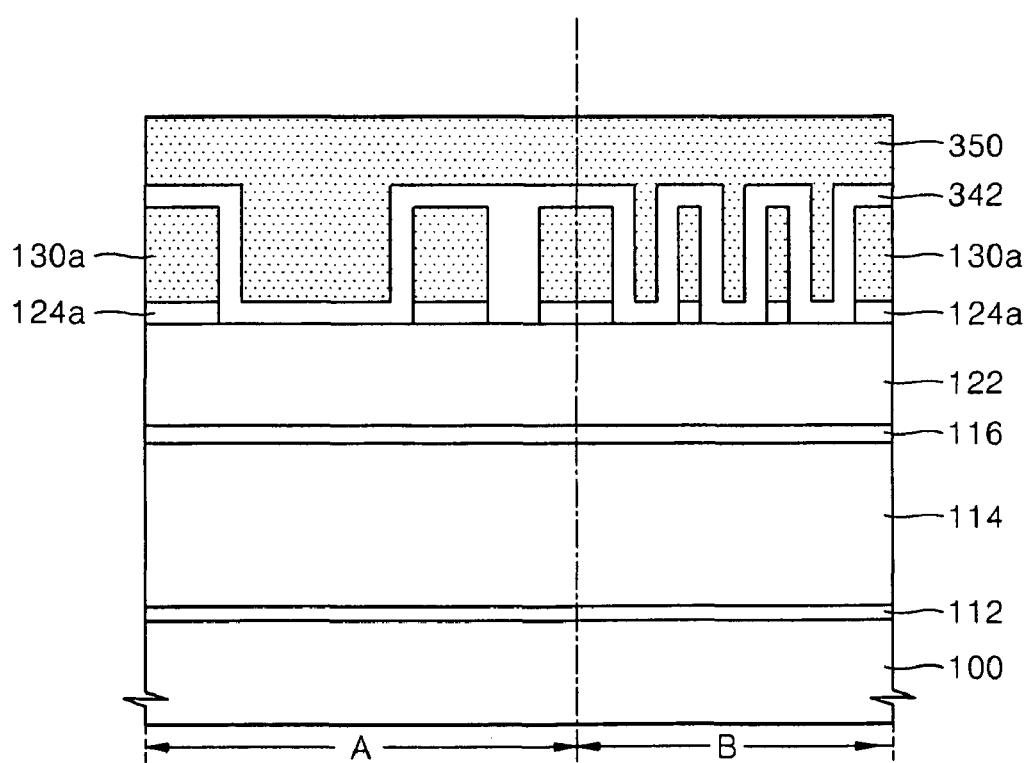

Referring to FIG. 3B, the second mask layer 350 may be formed on the third capping layer 342 in the low and high density pattern areas A and B. The second mask layer 350 may completely fill the recess areas 344 and cover upper surfaces of the third capping layer 342. The detailed features of the second mask layer 350 may be substantially similar to those of the second mask layer 150 described previously with reference to FIG. 1F, and therefore, its detailed description will not be repeated herein.

Figure 3C:
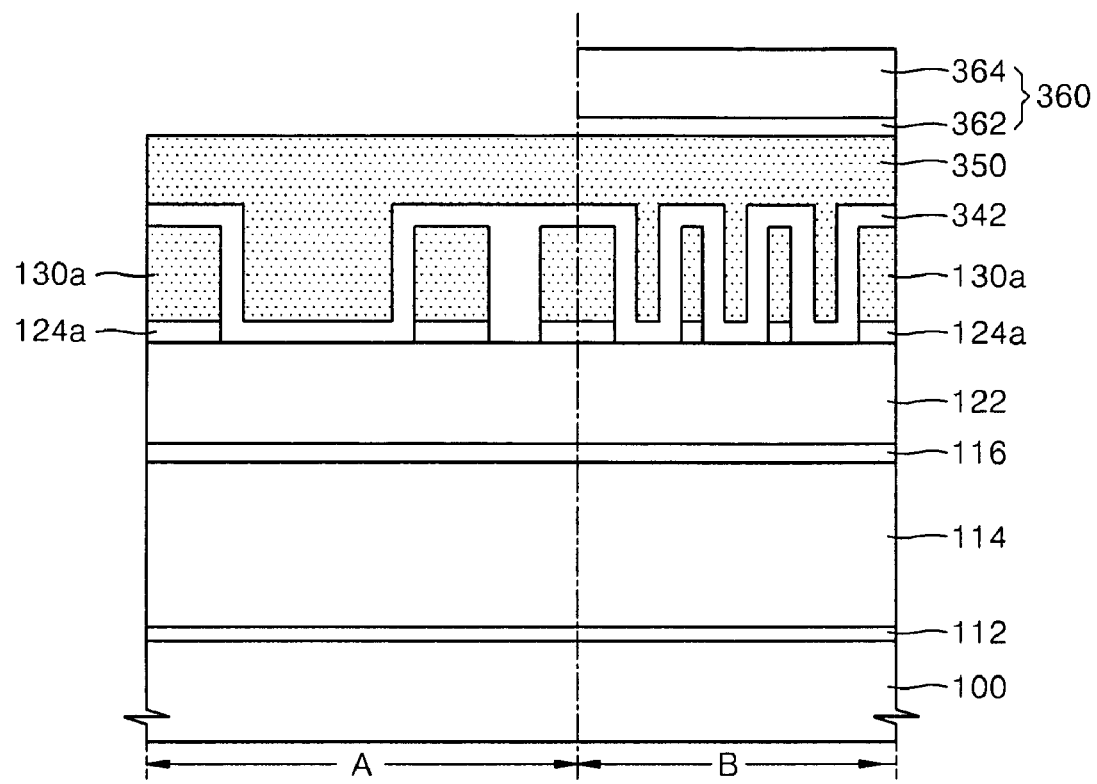

Referring to FIG. 3C, a mask pattern 360 may be selectively formed on the second mask layer 350 in the, e.g., high density pattern area B. The mask pattern 360 may be formed by sequentially depositing, e.g., an antireflection film pattern 362 and a photoresist pattern 364, on the second mask pattern 350. The mask pattern 360 may be formed to prevent double patterning in a region overlapping therewith. Accordingly, formation of the mask pattern 360 in either the low density pattern area A or the high density pattern area B is within the scope of the present invention, and may be determined with respect to process design and specifications. The mask pattern 360 may be formed of any suitable material, e.g., a substantially same material as a hard mask pattern.

Figure 3D:
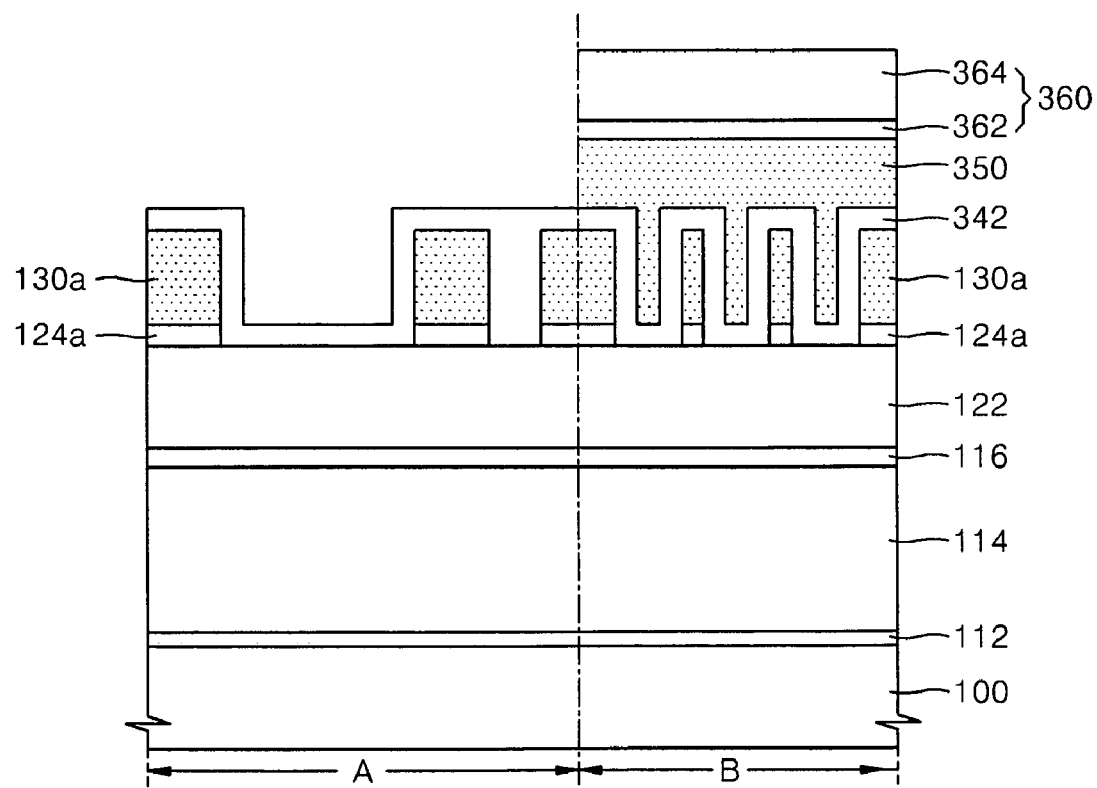

Referring to FIG. 3D, the second mask layer 350 may be etched using the mask pattern 360 as an etch mask, so a portion of the second mask layer 350 in the low density pattern area A may be completely removed. As a result, a portion of the second mask layer 350 may remain only in the high density pattern area B. During removal of the second mask layer 350 in the low density pattern area A, the third capping layer 342 exposed in the low density pattern area A may be removed.

Figure 3E:
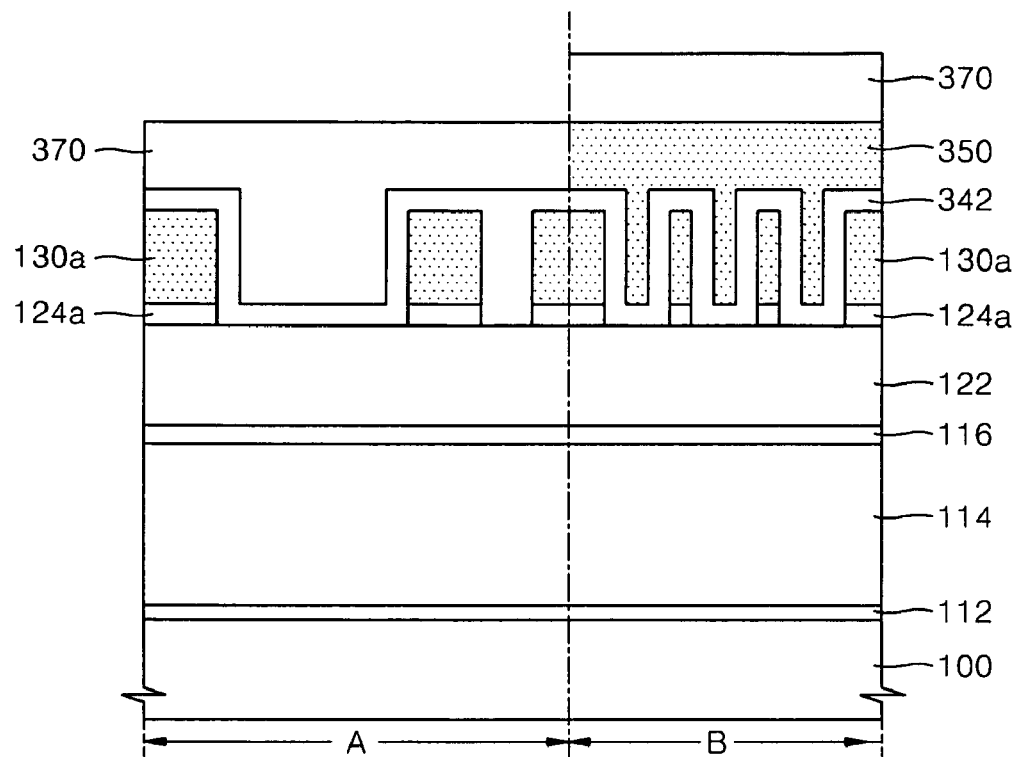

Referring to FIG. 3E, once the second mask layer 350 is removed from the low density pattern area A, the mask pattern 360 may be removed from the high density pattern area B, and a fourth capping layer 370 may be formed on the third capping layer 342 in the low density pattern area A and on the second mask layer 350 in the high density pattern area B. If the third capping layer 342 is removed from the low density pattern area A during removal of the second mask layer 350, the fourth capping layer 370 may be formed on the hard mask layer 122 in the low density pattern area A. A detailed description of the fourth capping layer 370 may be substantially similar to that of the first capping layer 140 described previously with reference to FIG. 1C, and therefore, will not be repeated herein.

Figure 3F:
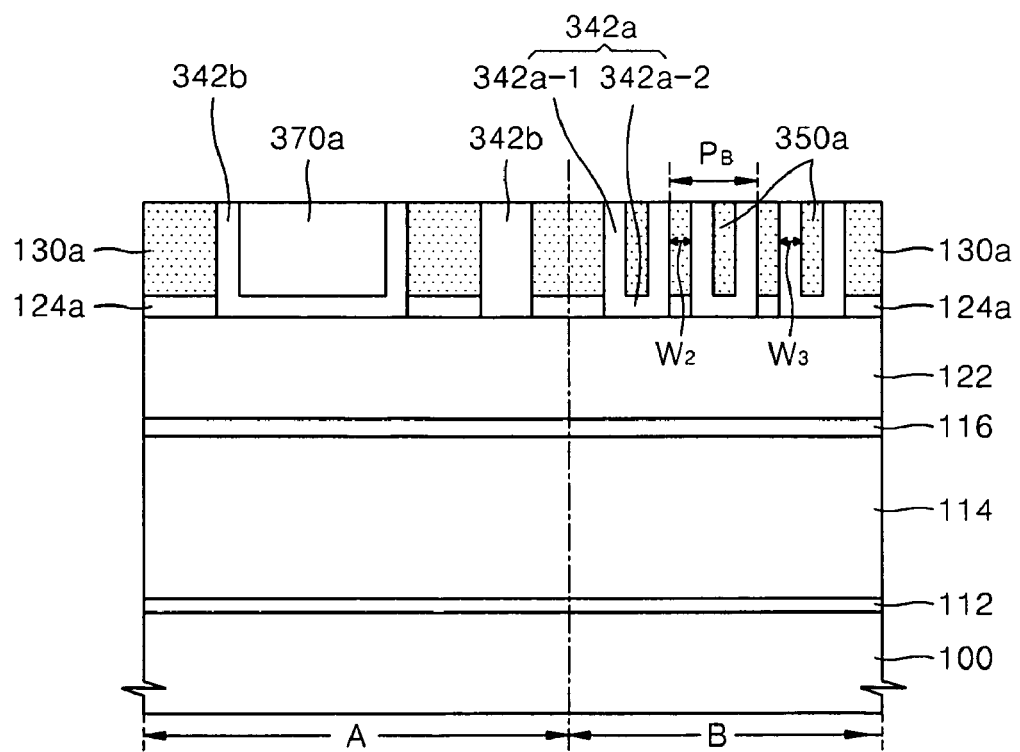

Referring to FIG. 3F, an upper portion of the fourth capping layer 370, the second mask layer 350, and an upper portion of the third capping layer 342 may be removed via, e.g., a CMP process, to form second mask patterns 350a and third capping layer patterns 342a between adjacent first mask patterns 130a. The second mask patterns 350a may have a substantially same pitch as the second pitch $P_B$, as described previously with reference to FIG. 1G.

Figure 4:
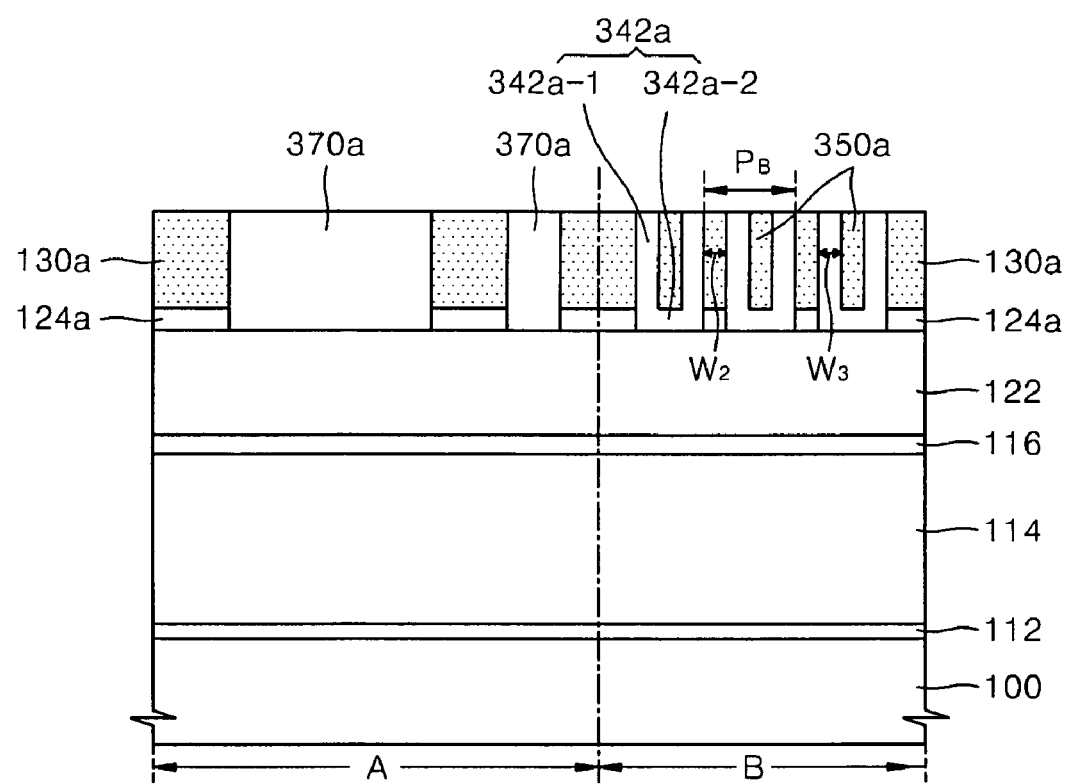
FIG. 4 illustrates a partial cross-sectional view of a semiconductor device during a stage of a method for forming fine pattern thereof according to another embodiment of the present invention.

The third capping layer patterns 342a and fourth capping layer patterns 370a, i.e., a residual portion of the fourth capping layer 370, may remain between the first mask patterns 130a in the low density pattern area A. In the high density pattern area B, the third capping layer patterns 342a may be formed between the first mask patterns 130a, so the second mask patterns 350a may be positioned in the recess areas 344 on the third capping layer patterns 342a. If the third capping layer 342 in the low density pattern area A is removed, as discussed previously with reference to FIG. 3A, the capping layer patterns 370a may be positioned between the first mask patterns 130a directly on the mask layer 122 in the low density pattern area A, as illustrated in FIG. 4. The third capping layer patterns 342a in the high density pattern area B may include vertical pattern portions 342a-1 and horizontal pattern portions 342a-2, and may have a substantially same structure as the second capping layer pattern 142a discussed previously with respect to FIG. 1G, and therefore, its detailed description will not repeated herein. Remaining stages in the method of forming fine pattern according to an embodiment illustrated in FIGS. 3A-3F may be substantially similar to the stages discussed previously with respect to FIGS. 1A-1K, and therefore, their detailed description will not be repeated herein. It is further noted that use of the first and second mask patterns 130a and 350a as etching masks, instead of using the vertical pattern portions 342a-1, third capping layer patterns 342a, and fourth capping layer patterns 370a, may be within the scope of the present invention, as previously described with reference to FIGS. 1A-1K.

The method for forming fine patterns of a semiconductor device according to an embodiment illustrated in FIGS. 3A-3F may provide patterning of an underlayer film to have varying pitches by using the first and second capping layer patterns as etching masks or the first and second mask patterns as etching masks for imparting varying pitch in predetermined regions. Thus, a simultaneous formation of fine patterns having varying sizes and/or pitches on a same substrate to form a plurality of wiring lines using a double patterning process may overcome a resolution limit in a photolithography process, eliminate film residues generated due to a difference in pattern density and/or width, and minimize defect generation. Further, the method may be advantageous in providing a single layout for depositing a conductive material directly into negative patterns, thereby facilitating formation of a wiring pattern with a varying pitch widths via a damascene process.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming fine patterns of a semiconductor device, comprising:
    forming an etching film on a substrate, the substrate having first and second areas;
    forming first mask patterns on the substrate, the first mask patterns having a first pattern density in the first area and a second pattern density in the second area;
    forming first capping patterns between the first mask patterns in the first area;
    forming second capping patterns between the first mask patterns in the second area, such that recess areas are formed between adjacent second capping patterns, and such that a first etching pattern is defined to include the first and second capping patterns;
    forming second mask patterns in the recess areas, such that a second etching pattern is defined to include the first and second mask patterns;
    removing one of the first and second etching patterns, such that a single etching pattern is remaining on the substrate; and
    etching the etching film using the remaining etching pattern as an etch mask to form etching film patterns.

2. The method as claimed in claim 1, wherein forming the first capping patterns, second capping patterns, and second mask patterns includes:
    forming a first capping layer on upper surfaces of and in spaces between the first mask patterns in the first area;
    forming a second capping layer on the upper surfaces of and in spaces between the first mask patterns in the second area, such that the recess areas are between vertical portions of the second capping layer;
    forming a second mask layer on upper surfaces of the second capping layer and in the recess areas of the first area; and
    removing upper portions of the second mask layer, second capping layer, and first capping layer to expose the upper surfaces of the first mask patterns.

3. The method as claimed in claim 2, wherein removing upper portions of the second mask layer, second capping layer, and first capping layer includes chemical mechanical polishing.

4. The method as claimed in claim 2, wherein forming the second capping layer includes forming the second capping layer in the second area.

5. The method as claimed in claim 1, wherein forming the first capping pattern, second capping pattern, and second mask patterns includes:
    forming a third capping layer on upper surfaces of and in spaces between the first mask patterns, such that recess areas are formed between the first mask patterns in the second area;
    forming a second mask layer on the third capping layer;
    removing the second mask layer from the first area, so a portion of the second mask layer is remaining in the second area;
    forming a fourth capping layer on the third capping layer and in the recess areas of the first area; and
    removing upper portions of the third capping layer, fourth capping layer, and second mask layer to expose the upper surfaces of the first mask patterns.

6. The method as claimed in claim 5, wherein removing upper portions of the third capping layer, fourth capping layer, and second mask layer includes chemical-mechanical polishing.

7. The method as claimed in claim 5, wherein the third capping layer is formed only in the second area.

8. The method as claimed in claim 5, wherein the third capping layer is formed in each of the first and second areas and the fourth capping layer is formed in the first area to form the first capping pattern.

9. The method as claimed in claim 1, wherein the etching film is formed of an insulation material or a conductive material.

10. The method as claimed in claim 1, wherein the first and second mask patterns are formed of polysilicon.

11. The method as claimed in claim 1, wherein the first and the second capping patterns are formed of an oxide and/or a nitride.

12. The method as claimed in claim 1, further comprising forming an over etching buffer layer on the etching film in the first and second areas before forming the first mask patterns, so the first mask patterns are formed on the over etching buffer layer.

13. The method as claimed in claim 12, wherein forming the first mask patterns includes:
    forming a first mask layer on the over etching buffer layer in the first and second areas; and
    forming a first mask pattern and an over etching buffer layer pattern having a first pattern density and a second pattern density in the first and second areas, respectively, by patterning the first mask layer and the over etching buffer layer.

14. The method as claimed in claim 12, wherein the over etching buffer layer is formed of a material having the same etching selectivity as that of the material for the second capping layer pattern.

15. The method as claimed in claim 12, wherein the over etching buffer layer is formed of a silicon nitride or a silicon oxide.

16. The method as claimed in claim 1, further comprising:
   forming a hard mask layer on the etching film before the first mask pattern is formed; and
   forming a hard mask pattern by etching the hard mask layer using the remaining etching pattern as an etch mask, wherein the remaining etching pattern and the hard mask pattern are used as etch masks to etch the etching film.

17. The method as claimed in claim 16, wherein the hard mask layer is formed of one or more of an oxide, a nitride, a silicon oxynitride, and/or an amorphous carbon layer.

18. The method as claimed in claim 1, wherein the etching film is an insulation film and the method further comprises forming a metal film in spaces between the etching film patterns.

19. The method as claimed in claim 18, wherein the metal film is formed of copper, tungsten, and/or aluminum.

20. The method as claimed in claim 1, wherein the etching film is a conductive film and the second etching pattern is used as an etch mask to etch the etching film.

* * * * *